(12) United States Patent
Ferriss et al.

(10) Patent No.: US 10,367,513 B2
(45) Date of Patent: Jul. 30, 2019

(54) SUPPRESSION OF NOISE UP-CONVERSION MECHANISMS IN LC OSCILLATORS

(71) Applicant: INTERNATIONAL BUSINESS MACHINES CORPORATION, Armonk, NY (US)

(72) Inventors: Mark A. Ferriss, Tarrytown, NY (US); Daniel J. Friedman, Sleepy Hollow, NY (US); Bodhisatwa Sadhu, Fishkill, NY (US); Wooram Lee, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 15/826,875

(22) Filed: Nov. 30, 2017

(65) Prior Publication Data

US 2019/0165796 A1   May 30, 2019

(51) Int. Cl.
*H03L 7/06*   (2006.01)
*H03L 7/099*   (2006.01)
(Continued)

(52) U.S. Cl.
CPC ........... *H03L 7/099* (2013.01); *H03B 5/1212* (2013.01); *H03B 5/1243* (2013.01); *H03L 7/104* (2013.01)

(58) Field of Classification Search
CPC ....... H03L 7/099; H03L 7/104; H03B 5/1212; H03B 5/1243
(Continued)

(56) References Cited

U.S. PATENT DOCUMENTS 5,019,791 A   5/1991 Cohen
5,382,922 A *  1/1995 Gersbach .................. H03L 1/00
                                                331/1 A
(Continued)

FOREIGN PATENT DOCUMENTS

EP   2146429 A1   1/2010
EP   2827374 A1   1/2015
(Continued)

OTHER PUBLICATIONS

Ismail et al., CMOS Differential LC Oscillator with Suppressed Up-Converted Flicker Noise, ISSCC 2003/ Session 5/ Wireless-Pan Transceivers / Paper 5.7, 2003 IEEE International Solid-State Circuits Conference, 8 pages.
(Continued)

*Primary Examiner* — Ryan Jager
(74) *Attorney, Agent, or Firm* — Michael A. Petrocelli

(57) ABSTRACT

A phase-locked loop circuit includes an oscillator, a frequency control device, the frequency control device generating a frequency control signal that controls a frequency of the oscillator, and a bias optimizer that monitors the frequency control device and generates a bias voltage for the oscillator, the oscillator includes a transfer function from bias voltage to frequency that is proportional to a transfer function from a low frequency noise component to frequency, the transfer function from bias voltage to frequency having a convex shape with a local minimum at which a sensitivity of the frequency to changes in the bias voltage is zero, and the bias voltage from the bias optimizer is set to the local minimum.

20 Claims, 8 Drawing Sheets

(51) Int. Cl.
*H03B 5/12* (2006.01)
*H03L 7/10* (2006.01)

(58) Field of Classification Search
USPC .......................................................... 327/159
See application file for complete search history.

(56) References Cited

U.S. PATENT DOCUMENTS

| | | | | |
|---|---|---|---|---|
| 5,504,459 | A * | 4/1996 | Gersbach | H03L 7/093 |
| | | | | 327/156 |
| 6,362,698 | B1 * | 3/2002 | Gupta | H03K 3/354 |
| | | | | 330/310 |
| 6,750,726 | B1 | 6/2004 | Hung et al. | |
| 6,838,951 | B1 * | 1/2005 | Nieri | H03L 7/1976 |
| | | | | 327/156 |
| 6,906,596 | B2 * | 6/2005 | Kitamura | H03L 5/00 |
| | | | | 327/156 |
| 7,342,461 | B1 | 3/2008 | Wood | |
| 7,414,488 | B2 | 8/2008 | Lee et al. | |
| 8,031,020 | B1 | 10/2011 | Tu et al. | |
| 8,604,889 | B2 * | 12/2013 | Duperray | H03B 5/1278 |
| | | | | 331/117 FE |
| 9,614,537 | B1 | 4/2017 | Nandwana et al. | |
| 2003/0076179 | A1 | 4/2003 | Branch et al. | |
| 2004/0183610 | A1 * | 9/2004 | Seppinen | B82Y 25/00 |
| | | | | 331/177 V |
| 2005/0110537 | A1 * | 5/2005 | Wurzer | H03L 7/093 |
| | | | | 327/156 |
| 2005/0258914 | A1 * | 11/2005 | Takagi | H03J 3/18 |
| | | | | 331/177 V |
| 2008/0266006 | A1 | 10/2008 | Min et al. | |
| 2009/0184771 | A1 | 7/2009 | Barton et al. | |
| 2009/0322391 | A1 * | 12/2009 | Lee | H03L 7/087 |
| | | | | 327/158 |

FOREIGN PATENT DOCUMENTS

| | | |
|---|---|---|
| EP | 2427962 B1 | 3/2016 |
| WO | 2005053149 A1 | 6/2005 |

OTHER PUBLICATIONS

Pepe et al., "Suppression of Flicker Noise Up-Conversion in a 65-nm CMOS VCO in the 3.0-to-3.6 GHz Band", IEEE Journal of Solid-State Circuits, vol. 48, No. 10, Oct. 2013, pp. 2375-2389.

Shahmohammadi et al., "A 1/f Noise Upconversion Reduction Technique for Voltage-Biased RF CMOS Oscillators", IEEE Journal of Solid-State Circuits, vol. 51, No. 11, Nov. 2016, pp. 2610-2624.

Tchamov et al., "Technique for Flicker Noise Up-Conversion Suppression in Differential LC Oscillators", IEEE Transactions on Circuits and Systems—II: Express Briefs, vol. 54, No. 11, Nov. 2007, pp. 959-963.

* cited by examiner

SUPPRESSION OF NOISE UP-CONVERSION MECHANISMS IN LC OSCILLATORS

This invention was made with government support under contract number: HR0011-12-C-0087 awarded by Defense Advanced Research Projects Agency (DARPA). The government has certain rights to this invention.

BACKGROUND

The present invention generally relates to semiconductor analog and logic circuits, and more particularly to a method of suppressing noise up-conversion mechanisms in inductor-capacitor (LC) oscillators.

Typically, near-carrier phase noise in complementary metal-oxide semiconductors (CMOS) LC oscillators is dominated by noise generated at low frequencies, and up-converted to frequencies around the carrier by non-linear effects within the oscillator. In CMOS the type of noise source that typically dominates is flicker noise. Flicker noise is a type of electronic noise, generated by most electronics devices, having a 1/f power spectral density, i.e., the power spectral density of the noise is inversely proportional to the frequency. CMOS devices including sub-micron feature sizes can generate substantial flicker noise (also referred to as "1/f noise") at frequencies up to a few Megahertz or more. While the signals generated by the oscillator of interest are typically much higher (in the GHz range), the up-conversion mechanisms within the oscillator result in the low frequency flicker noise being up-converted, and dominating the noise profile at frequencies close to the carrier.

SUMMARY

According to an embodiment of the present disclosure, a phase-locked loop (PLL) circuit may include an oscillator, a frequency control device, the frequency control device generating a frequency control signal that controls a frequency of the oscillator, and a bias optimizer that monitors the frequency control device and generates a bias voltage for the oscillator, the oscillator may include a transfer function from bias voltage to frequency that is proportional to a transfer function from a low frequency noise component to frequency, the transfer function from bias voltage to frequency having a convex shape with a local minimum at which a sensitivity of the frequency to changes in the bias voltage is zero, and the bias voltage from the bias optimizer is set to the local minimum.

According to another embodiment of the present disclosure, a method for suppressing noise up-conversion may include providing a PLL circuit including an oscillator, a frequency control device, the frequency control device generating a frequency control signal that controls a frequency of the oscillator, and a bias optimizer that monitors the frequency control device and generates a bias voltage for the oscillator, the oscillator may include a transfer function from bias voltage to frequency that is proportional to a transfer function from a low frequency noise component to frequency, the transfer function from bias voltage to frequency having a convex shape with a local minimum at which a sensitivity of the frequency to changes in the bias voltage is zero, determining the local minimum of the transfer function from bias voltage to frequency, and setting the bias voltage from the bias optimizer to the local minimum.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
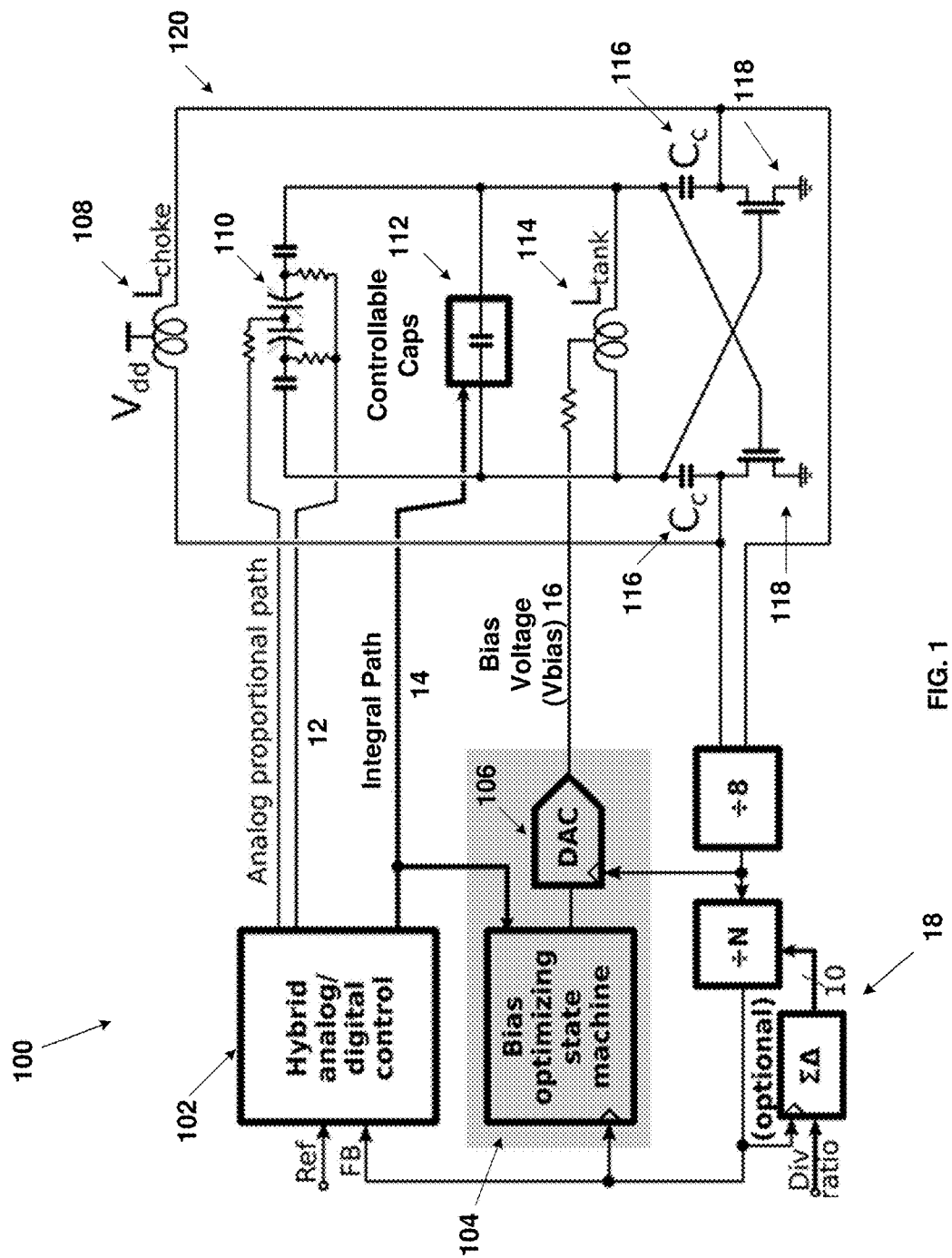
FIG. 1 depicts a diagram illustrating implementation of a closed loop biasing system on PLL circuit, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The phase noise performance of CMOS phase-locked loops (PLLs) continues to be critical for achieving performance targets in a wide range of systems, from mm-wave radios to high performance data converters to high data rate wireline macros. For example, in the 45 nm CMOS node and below, voltage controlled oscillator (VCO) phase noise performance is significantly curtailed by low supply voltages, low Q passives, and lossy substrates. While VCO noise can be suppressed by increasing the PLL's bandwidth, maintaining a narrow bandwidth is often required to suppress noise from other sources, including the PLL's reference clock distribution network and charge-pump. The VCO's phase noise at low offsets from the carrier is typically dominated by noise generated at low frequencies and upconverted inside the oscillator. Consequently, flicker noise can dominate the phase noise profile at frequency offsets of up to several MHz, limiting performance for a wide range of PLL bandwidth settings.

Typically, oscillators are used to generate a signal having a high frequency. A non-linear operation of components within the oscillator up-convert noise present within the oscillator from low frequency noise to high frequency noise. The up-converted noise produces phase noise in the carrier signal and noise skirts on either side of the carrier frequency.

Frequency conversion describes the process in which a signal generated at one frequency is converted to a different frequency. This frequency conversion may occur whenever a non-linear operation is applied to a signal. For example, a Taylor expansion of an arbitrary non-linear transconductor, may generate and output current $I_{out}(t)$ from an input voltage $V_{in}(t)$, with the transfer function $I_{out}(t)=a_0+a_1 V_{in}(t)+a_2 V_{in}^2(t)+a_3 V_{in}^3(t)+\ldots$. Next, considering the consequences if the input to the transconductor, $V_{in}(t)$, is the sum of two terms, $A_1 \cos(\omega_o t)$, and $A_n \cos(\omega_n t)$, where $\omega_n \ll \omega_o$. For the sake of simplicity, only the effects of the second order term, $a_2$ are considered, as illustrated in equation 1 below.

$$a_2 V_{in}^2(t) = a_2(A_1 \cos(\omega_o t) + A_n \cos(\omega_n t))^2 = a_2 A_1^2 \cos^2(\omega_o t) + A_n^2 \cos^2(\omega_n t) + A_n A_1 \cos(\omega_o t)\cos(\omega_n t) \quad \text{Equation 1}$$

Focusing on the last term, the following is observed:

$$A_n A_1 \cos(\omega_o t)\cos(\omega_n t) = A_n A_1 \cos((\omega_o+\omega_n)t) + A_n A_1 \cos((\omega_o-\omega_n)t) \quad \text{Equation 2}$$

That is to say, a tone generated at a frequency $\omega_n$, was converted to a frequency $(\omega_o+\omega_n)$ by the second order non-linearity. If $\omega_o$ represents the frequency of oscillation, and $\omega_n$ is a low frequency tone such that $\omega_n \ll \omega_o$, the low frequency tone was upconverted to a frequency close to $\omega_o$. Similar frequency translation effects may occur due to the other terms, $a_3$, $a_4$, etc., and frequency translation may occur due to the cross product between terms. Thus, even if the frequency $\omega_n$ is small compared with $\omega_o$, its effects may still be observed at frequencies close to $\omega_o$, because of the up-conversion mechanisms.

In the oscillator itself, the transconductor is non-linear. Consequently, any low frequency noise sources that are added to the transconductor input will be up-converted to frequencies close to the carrier. In fact, in a practical oscillator, there are potentially many non-linear components and mechanisms that may contribute to this frequency conversion. For example, the oscillators capacitances are typically non-linear. Considering the case of a low frequency band-limited noise source, the same up-conversion mechanism described above may occur. Consequently, noise generated at low frequencies may be upconverted by the non-linearities within the oscillator, and appear as noise skirts around the carrier frequency.

While the underlying low frequency noise sources within the oscillator are an unavoidable attribute of the technology, the up-conversion mechanisms are not. Several methods for suppressing noise up-conversion have been proposed; however, they use open loop control methods relying on the absolute value of components to produce the requisite phase shifts and high frequency impedances, respectively.

Therefore, embodiments of the present disclosure may, among other potential benefits, provide a closed loop biasing system for suppressing noise up-conversion mechanisms. Specifically, a background calibration system may be implemented in a phase-locked loop (PLL) circuit to dynamically find an oscillator's bias point such that up-conversion from DC to RF of certain noise sources, including flicker noise, can be minimized.

The present invention generally relates to semiconductor analog and logic circuits, and more particularly to a method of suppressing noise up-conversion mechanisms in LC oscillators. One way to suppress noise up-conversion mechanisms may include implementing a closed loop biasing system on a PLL circuit. One embodiment by which the closed loop biasing system can be implemented is described in detailed below by referring to the accompanying drawings in FIGS. 1-4.

Referring now to FIG. 1, a diagram illustrating implementation of a closed loop biasing system on a hybrid digital/analog PLL circuit 100 (hereinafter "PLL circuit") is shown, according to an embodiment of the present disclosure. The PLL circuit 100 may include a bias optimizing state machine 104 (also referred to as "bias optimizer") for optimizing a bias voltage 16 of an oscillator 120. In this embodiment, the oscillator 120 may be, for example, a voltage controlled oscillator (VCO).

A frequency control device 102 may control the oscillator center frequency while being monitored by the bias optimizing state machine 104. In an embodiment, the frequency control device 102 may include a hybrid/analog digital control. An output from the bias optimizing state machine 104 may be used to control a digital-to-analog converter (DAC) 106. Stated differently, the bias optimizing state machine 104 may generate a control signal for the bias DAC 106 and monitor control signals for the PLL circuit 100. The output of the DAC 106 may include the bias voltage 16 of the oscillator 120.

The core architecture of the PLL circuit 100 may also include an analog proportional path 12 to control the capacitance of an analog varactor (variable capacitor) structure 110, where the analog varactor structure 110 may control the frequency of the oscillator 120. An integral path 14 may provide a frequency control signal for the oscillator 120 by controlling a bank of capacitors (e.g., controllable caps 112). In some embodiments, the integral path 14 may digitally control the frequency of the oscillator 120. The frequency control signal (also referred to as integral path control word or frequency control word) is available to the bias optimizing state machine 104. The PLL circuit 100 may adjusts the frequency control signal to keep the frequency of the oscillator 120 at the correct value.

The topology of the oscillator 120 may also include a biasing choke inductor ($L_{choke}$) 108 (hereinafter "choke inductor") and a tank inductor ($L_{tank}$) 114. A center tap of the tank inductor 114 may be controlled by the bias optimizing state machine 104 and associated DAC 106. The tank inductor 114 is the primary inductor for the oscillator 120. The choke inductor 108 may be typically used to provide a DC current to transistors 118, specifically, the choke inductor 108 may provide a DC current at the transistor drains, independent of a gate bias. A power supply $V_{dd}$ is connected to a center tap of the choke inductor 108.

It should be noted that the topology of the oscillator 120 depicted in FIG. 1 is not typical. This topology may allow direct control of the bias voltage 16 and cause a transfer function from bias voltage to frequency being proportional to a transfer function for certain noise sources (low frequency noise) to frequency. Stated differently, the proposed configuration of the PLL circuit 100 and, more particularly, of the oscillator 120 may cause a transfer function from the bias voltage ($V_{bias}$) 16 to an output frequency of the oscillator 120 to be proportional to the transfer function from a common mode noise component of the transistors gate-referred noise to the output frequency.

With continued reference to FIG. 1, a coupling cap (Cc) 116 may provide that the DC value of the voltage on the drain of the transistors 118 is decoupled from the bias voltage 16. As such, the DC voltage of the bias voltage 16 may not affect the DC voltage at a drain node of the transistors 118.

It should be note that additional elements of the PLL circuit 100, namely sigma-delta (ΣΔ), ÷N, ÷8 are all part of a programmable divider 18, which is a standard component in many PLL circuits and, as such, known by any person skilled in the art. Similarly, reference (Ref) and feedback (FB) indicators denote typical PLL control signals.

The oscillator 120 is designed such that it has an external controllable bias voltage (e.g., bias voltage 16). The bias voltage 16 may control an operating point of the transistors 118 in the oscillator 120. In an embodiment, the oscillator 120 may be configured in a way such that the transfer function from bias voltage 16 to output frequency has the same path of other noise sources in the system, e.g., the common mode of the flicker noise of the gate. Specifically, the oscillator 120 may be designed such that the transfer function from bias voltage 16 to output frequency is convex, and a local minimum exists at which the frequency sensitivity to perturbations or changes in the bias voltage 16 is zero.

As described above, the bias optimizing state machine 104 controls the bias voltage 16 through the DAC 106. However, in some exemplary embodiments, the bias optimizing state machine 104 can internally generate (e.g., via an internal DAC) the analog bias voltage 16. As such, owing to the convexity of the transfer function from bias voltage to frequency in the oscillator 120, a gradient descent algorithm may be implemented by the bias optimizing state machine 104 to find a minimum sensitivity point at which changes in the bias voltage 16 may not affect the output frequency of the oscillator 120, as will be described in detail below with reference to FIGS. 2A-2B.

Figure 2A:
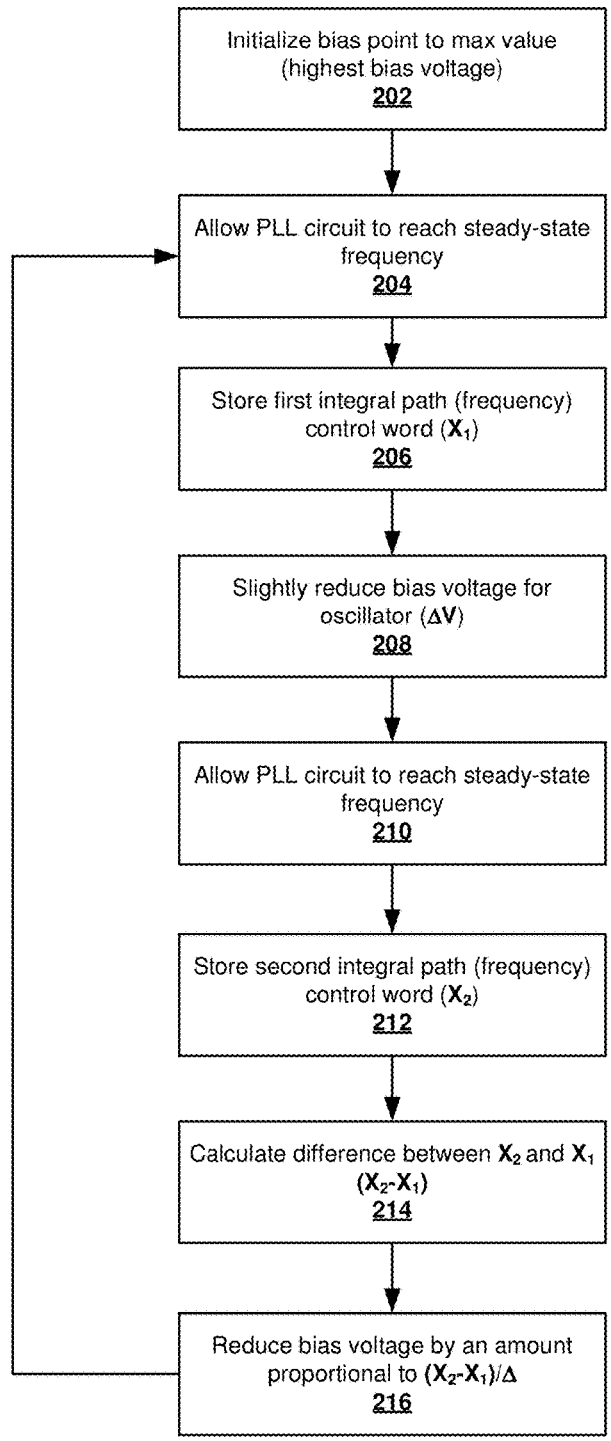
FIGS. 2A-2B depict the steps of a gradient descent algorithm implemented to find a minimum sensitivity point, according to an embodiment of the present disclosure.
Figure 2B:
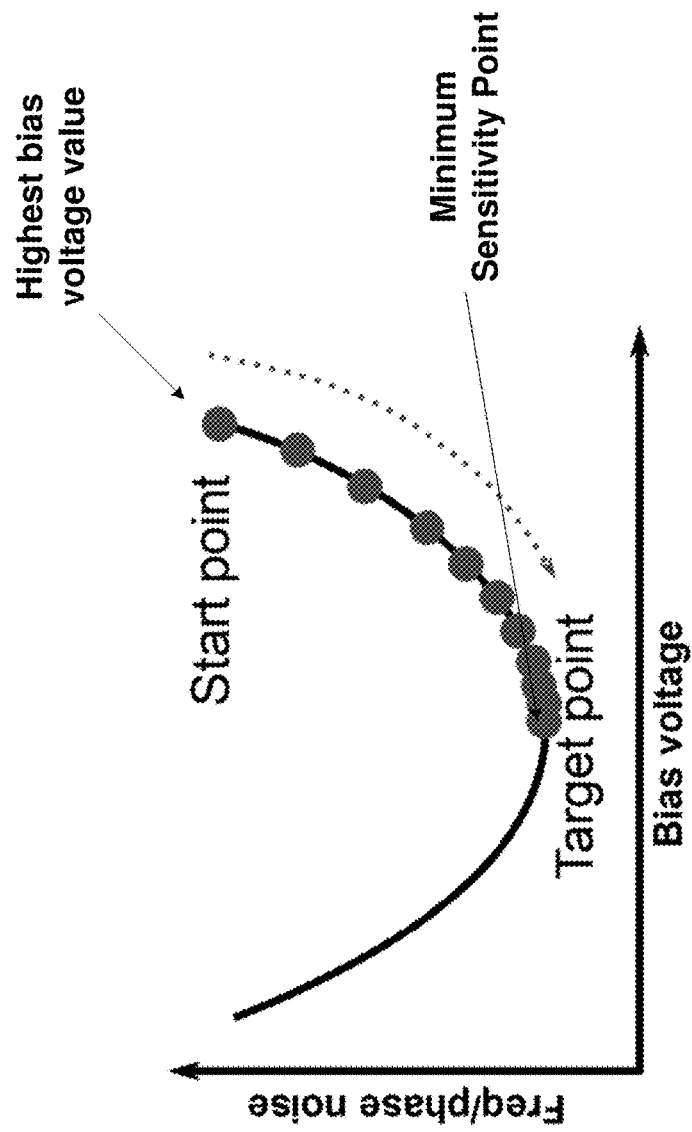

Referring now to FIGS. 2A-2B, a flowchart (FIG. 2A) illustrating the steps of a one-dimensional gradient descent algorithm implemented by the bias optimizing state machine 104 (FIG. 1) to find a minimum (optimum bias voltage) sensitivity point (FIG. 2B) is shown, according to an embodiment of the present disclosure. Since a shape of the transfer function from bias voltage 16 to output frequency is convex, as illustrated in FIG. 2B, the gradient descent algorithm may be applied to find local minimum corresponding to a point at which changes in the bias voltage 16 (FIG. 1) may not affect a frequency of the oscillator 120 (FIG. 1) for the PLL circuit 100 of FIG. 1.

It should be noted that the main objective of the proposed configuration for the PLL circuit 100 (FIG. 1) is to minimize the gain of noise up-conversion transfer functions; however, direct on-chip measurement of phase noise is not feasible in an embedded PLL application. Instead, noise performance may be inferred relative to its optimum by measuring a characteristic of a similar transfer function, namely, the gain from bias voltage to oscillator's output frequency. In this embodiment, this may be achieved by adding a deterministic small disturbance (e.g., a differential voltage ΔV) to the bias voltage 16 and measuring the resulting changes to PLL control signals (e.g., Ref and FB signals in FIG. 1).

The process starts at 202 where the bias voltage 16 (FIG. 1) is initialized to its maximum value (highest bias voltage). Next, a timeout is applied at 204 to allow the PLL circuit 100 (FIG. 1) reaching a steady-state frequency.

At 206, the bias optimizing state machine 104 (FIG. 1) records a first frequency control signal $X_1$ on the integral path 14 (FIG. 1) of the PLL circuit 100 (FIG. 1). As described above, an integral path control word or frequency control signal controls the frequency of the oscillator 120 by changing the oscillator's capacitance. Subsequently, at 208, the bias optimizing state machine 104 (FIG. 1) reduces the bias voltage 16 (FIG. 1) by a differential amount (ΔV).

Next, another timeout is applied at 210 to allow the PLL circuit 100 (FIG. 1) to resettle, i.e., reaching again a steady-state frequency. The bias optimizing state machine 104 (FIG. 1) may, at 212, record a second (new) frequency control signal $X_2$ on the integral path 14 (FIG. 1). At this point, unless the bias voltage 16 is already at its minimum sensitivity point, the change to the bias voltage 16 results in a change in the oscillator frequency. Accordingly, the PLL circuit 100 (FIG. 1) forces the oscillator 120 (FIG. 1) back to its original frequency by changing the frequency control signal for the integral path 14.

At 214, the bias optimizing state machine 104 (FIG. 1) calculates the difference between the first frequency control signal ($X_1$) and the second frequency control signal ($X_2$). Stated differently, the bias optimizing state machine 104 (FIG. 1) calculates the difference between recorded frequency control signals before ($X_1$) and after ($X_2$) reducing the bias voltage 16 by the differential amount ΔV. The difference $X_2-X_1$ corresponds to the amount the PLL circuit 100 (FIG. 1) changed the first frequency control signal on the integral path 14 to correct for changes in the bias voltage 16. Assuming the gain of the integral path 14 is constant then the local gradient of the bias sensitivity is proportional to $(X_2-X_1)/\Delta$.

Then, at 216, the bias voltage 16 is reduced by an amount in proportion to $(X_2-X_1)/\Delta$ in a negative direction as shown in FIG. 2B. This updated bias voltage becomes the new starting point for the next iteration of the gradient descent algorithm. If the PLL circuit 100 (FIG. 1) has already reached the target or minimum sensitivity point (See FIG. 2B), then adding a deterministic disturbance (ΔV) to the bias voltage 16 may not change the frequency of the oscillator 120, since $X_2$ is equal to $X_1$, and $(X_2-X_1)/\Delta$ is equal to zero. The process returns to 204, with the initial bias voltage for the next iteration being the last bias voltage reduced in proportion to $(X_2-X_1)/\Delta$.

The operation of the PLL circuit 100 of FIG. 1 takes advantage of the similarity between the DC to RF transfer function of the bias voltage 16 and the DC to RF transfer function of the noise sources in series with the gates of the transconductor transistors (e.g., transistors 118), where these noise sources represent a reasonable model for flicker noise and biasing supply noise. If these transfer functions match, a minimum in one transfer function may align with the minimum in the other. To gain insight into the relationship between the two transfer functions, the effects of two independent sources placed in series with the gates of the transconductors may be considered. These can be decomposed into a differential component ($V_{diff}$) and a common mode component ($V_{cm}$), where the effects of each are considered separately, as will be described below in FIG. 3.

Figure 3:
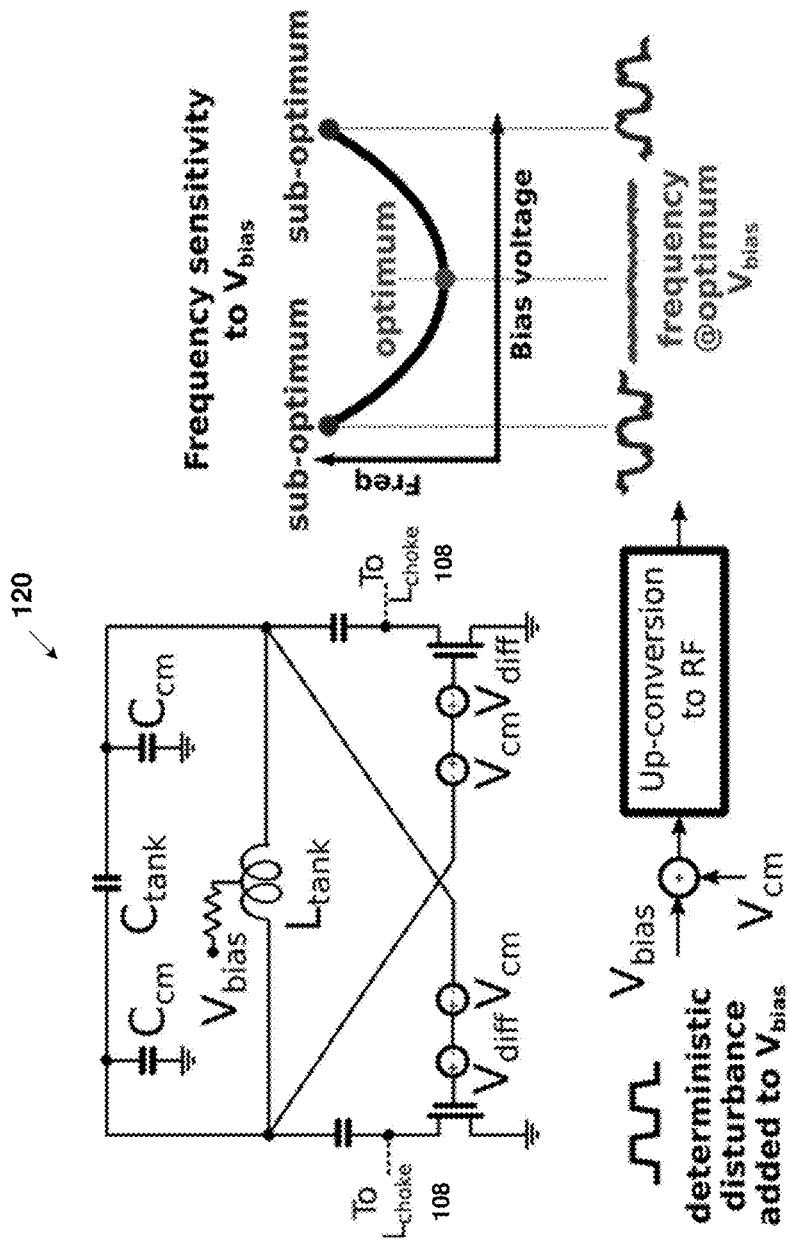
FIG. 3 depicts decomposition of an oscillator into differential components and common mode components according to an embodiment of the present disclosure.

Referring now to FIG. 3, decomposition of the transistor's input referred noise into differential components ($V_{diff}$) and common mode components ($V_{cm}$) is shown, according to an embodiment of the present disclosure. As described above, the effects of the differential noise components and the common mode noise components are considered separately. As known in the art, any pair of voltages sources may be expressed in terms of a differential component ($V_{diff}$) and common mode component ($V_{cm}$). This decomposition is valid without assuming anything about the underlying properties of the voltage sources. The common mode component $V_{cm}$ modulates the output frequency of the oscillator 120 through a combination of effects including amplitude to phase conversion through the non-linear varactors and transconductor capacitances, and the Groszkowski effect.

At frequencies close to DC, where the inductors ($L_{choke}$, $L_{tank}$) are shorts and the capacitors ($C_{cm}$, $C_{tank}$) are opens, the common mode component $V_{cm}$ is in series with the bias voltage ($V_{bias}$). In such cases, the up-conversion of the differential component $V_{diff}$ is suppressed by the symmetry of the oscillator 120. Furthermore, for the proposed oscillator topology, in both simulation and measurement, the transfer function from $V_{bias}$ to frequency is convex, as described above, and as such the gradient descent algorithm may be applied to find the minimum sensitivity point in the PLL circuit 100 of FIG. 1. Irrespective of the number of up-conversion mechanisms, the minimum sensitivity point may correspond to an aggregate null of the combination of all up-conversion mechanisms associated with the sources in series with the transconductor gates.

Consequently, by changing the bias voltage ($V_{bias}$), the minimum sensitive point at which the oscillator's output frequency is least sensitive to $V_{bias}$ perturbations may be found, this minimum sensitivity point may also correspond to a point at which the oscillator is least sensitive to the common mode noise component ($V_{cm}$). As such, noise up-conversion mechanisms may be suppressed in the oscillator 120.

Figure 4:
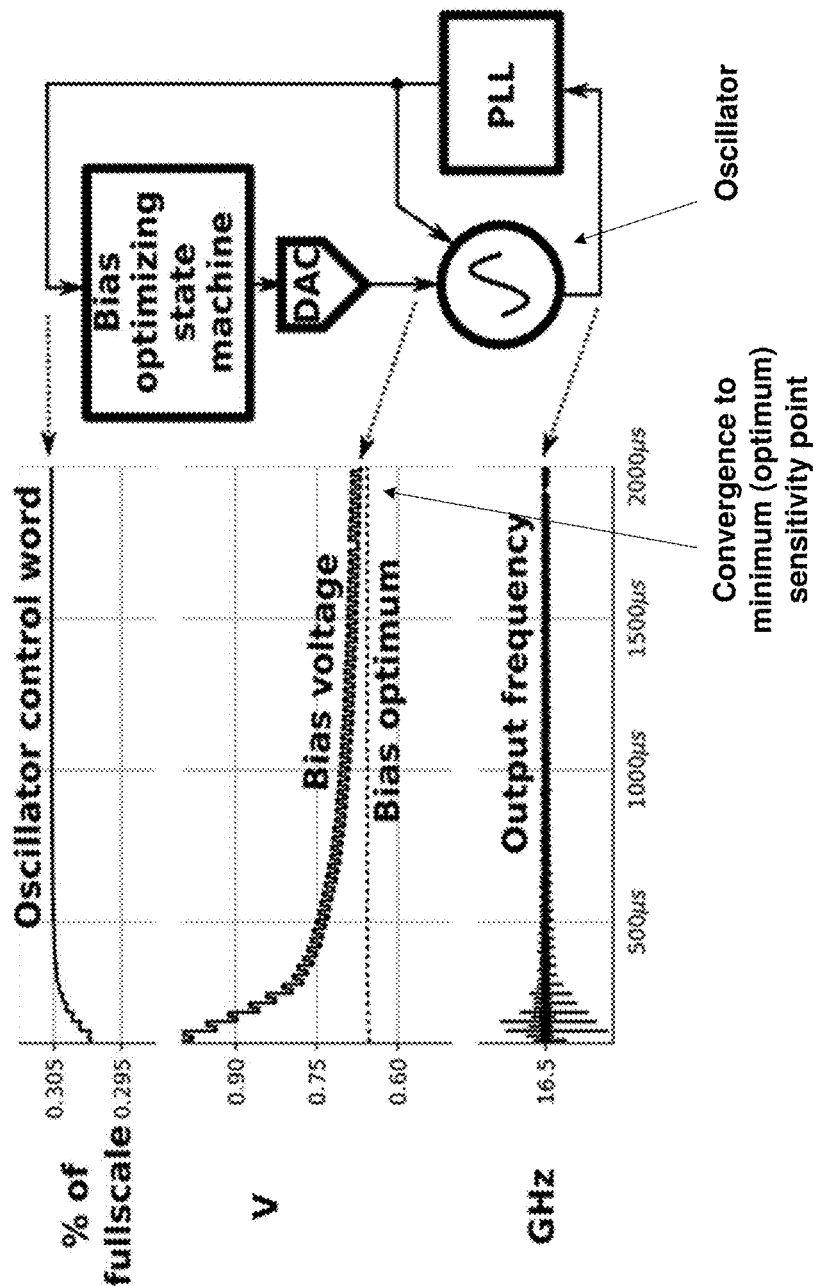
FIG. 4 depicts a behavioral simulation demonstrating convergence of the proposed biased optimization scheme, according to an embodiment of the present disclosure.

Referring now to FIG. 4, a behavioral simulation demonstrating convergence of the proposed biased optimization scheme of FIGS. 1-3 is shown, according to an embodiment of the present disclosure. First, the PLL is allowed to lock with the bias voltage initialized at its maximum value as described above. Next, the value of the oscillator frequency control signal is recorded, and a small step (e.g., $\Delta V$) is applied to the bias voltage. After a timeout for the PLL to resettle, a new value of frequency control signal is recorded. If the bias voltage is not at a zero-sensitivity point, then changes to the bias voltage may change the output frequency of the oscillator. The PLL may detect and reject this frequency change by modifying the frequency control signal. Therefore, the difference in the frequency control signal before and after the bias step divided by the step size is a measure of the bias voltage to frequency transfer function gradient. Next, the bias voltage is moved by a step ($\Delta V$) scaled in proportion to that measured result. The algorithm iterates as described above, and the bias voltage asymptotically approaches the minimum sensitivity point as shown in FIG. 4.

As such, by implementing the proposed PLL configuration, embodiments of the present disclosure may substantially suppress noise up-conversion mechanisms in CMOS LC oscillators by automatically detecting a minimum sensitivity point (optimum phase noise) at which a sensitivity of the oscillator's frequency to bias voltage changes is zero without the use of an on-chip spectrum analyzer.

Another embodiment by which the closed loop biasing system may be implemented to suppress noise up-conversion mechanisms may include LC oscillators exposed to non-stationary or transient frequencies. This embodiment is described in detailed below by referring to the accompanying drawings in FIGS. 5-6B.

Figure 5:
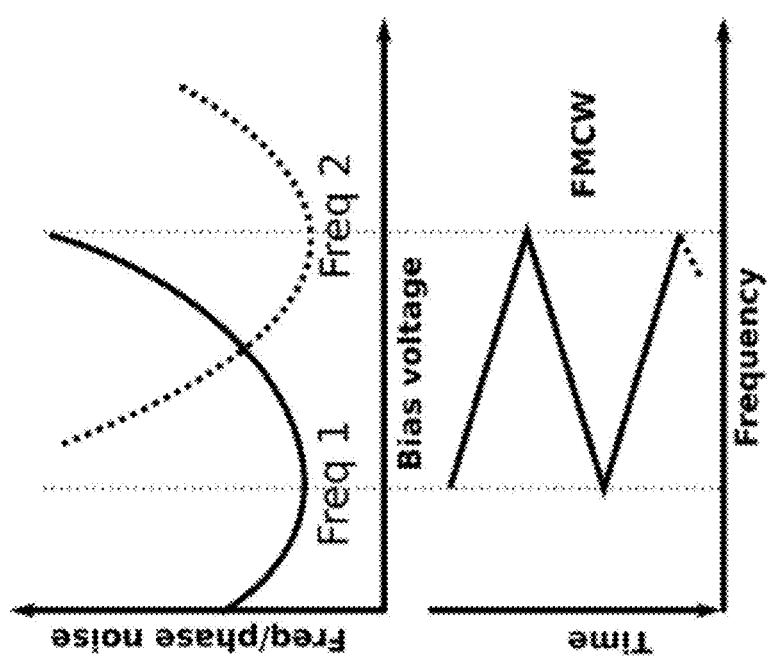
FIG. 5 depicts an exemplary situation in which the oscillator includes a non-stationary frequency, according to an embodiment of the present disclosure.

Referring now to FIG. 5, a plot depicting an exemplary situation in which the oscillator 120 (FIG. 1) includes a non-stationary frequency is shown, according to an embodiment of the present disclosure. In this embodiment, the non-stationary frequency may include a Frequency Modulated Continuous Wave (FMCW) source. In this situation, the minimum (optimum) sensitivity point may change with time. Consequently, the bias voltage 16 (FIG. 1) may need to be dynamically changed in order to find the minimum sensitivity point as will be described below with reference to FIGS. 6A-6B.

Figure 6A:
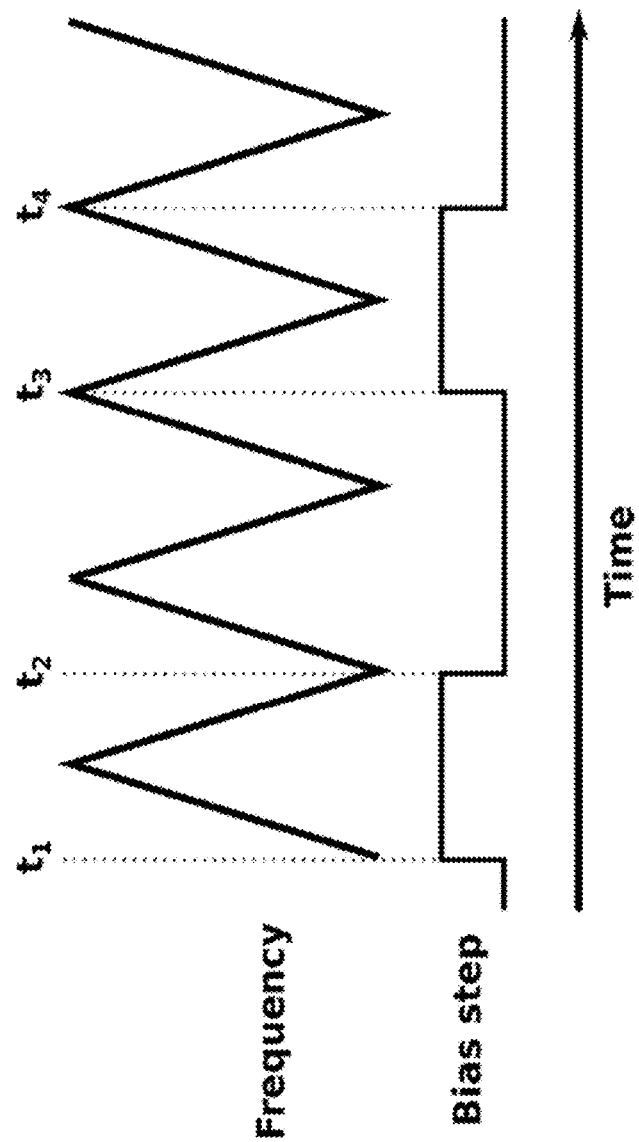
FIGS. 6A-6B illustrate a process to determine a minimum sensitivity point in embodiments in which the oscillator's frequency is non-stationary, according to an embodiment of the present disclosure.
Figure 6B:
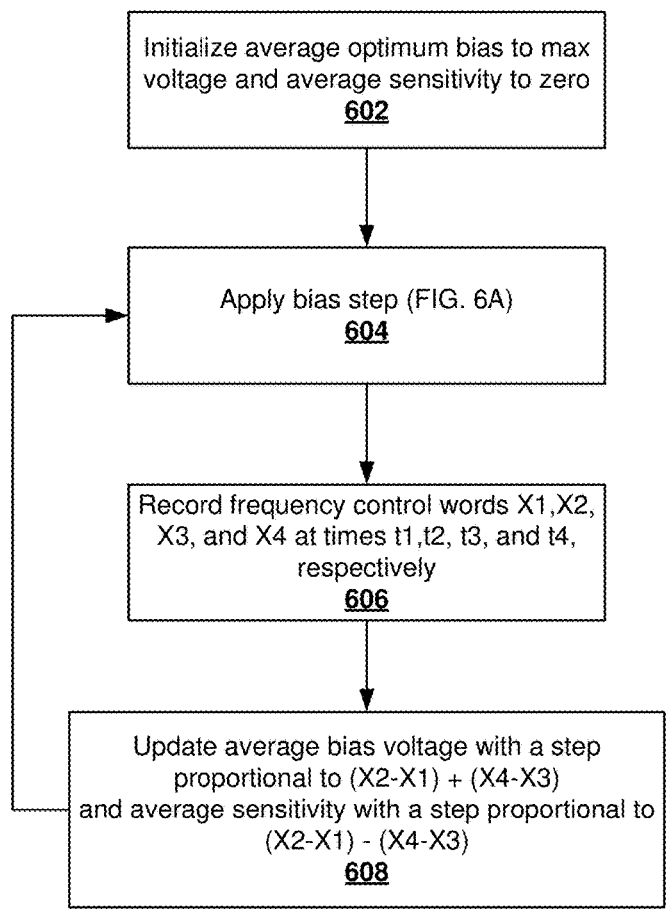

Referring now to FIGS. 6A-6B, a process to determine the minimum sensitivity point in embodiments in which the oscillator's frequency is non-stationary is shown, according to an embodiment of the present disclosure. As illustrated in FIG. 6A, one way to determine the minimum sensitivity point in FMCW systems may include coordinating the determination of the minimum sensitivity point with a waveform of the oscillator frequency.

In an FMCW system, the frequency of the PLL circuit 100 (FIG. 1) is modulated with a triangular shaped waveform, an example of which is shown in FIG. 5. A modulation state-machine (not shown) may typically be integrated into the PLL circuit 100 (FIG. 1) to control a programmable divider 18 (FIG. 1) through the sigma-delta ($\Sigma\Delta$). The bias optimizing state machine 104 (FIG. 1) may access an instantaneous frequency of the PLL circuit 100 (FIG. 1), as specified by the modulation state-machine. If the frequency of the oscillator 120 (FIG. 1) is swept over a substantial portion of its range, then the bias voltage 16 (FIG. 1) which provides the optimum noise performance may also change with time.

It should be noted that the gradient descent algorithm previously described assumes the target frequency and the optimum bias value are stationary. Therefore, the method previously described needs to be modified to cover embodiments in which the frequency of the PLL circuit 100 (FIG. 1) is changing with time, provided the characteristics of the modulation (i.e. the FMCW waveform) are available to the bias optimizing state machine 104 (FIG. 1). In such embodiments, the optimum bias voltage may follow a profile similar to that of the FMCW waveform.

Because the frequency is changing with time, the optimum bias voltage is also time dependent. The optimum may be approximated with two parameters: 1) an average optimum bias voltage ($V_{bias\_av}$) across one FMCW cycle; 2) a sensitivity ($K_{sens}$), or gain, of the optimum bias voltage to frequency. The bias voltage is to be generated such that $V_{bias}(t)=V_{bias\_av}+K_{sens}*(F_{fmcw}(t)-\text{mean}(F_{fmcw}(t)))$, where $V_{bias}(t)$ is the bias voltage, $F_{fmcw}(t)$ is the FMCW frequency profile.

The process to determine the average optimum bias voltage, $V_{bias\_av}$, and the sensitivity of the optimum bias to frequency, $K_{sens}$ may be similar to the process described above with reference to FIGS. 2A-2B, except that, in this embodiment, the addition and subtraction of the bias step (e.g., $\Delta V$) may be coordinated with the FMCW waveform. As show in FIG. 6A, a bias step may be added and then removed on the minimum ($t_1$, $t_2$), and maximum ($t_3$, $t_4$) points of the FMCW waveform, and the value of the frequency control signal (integral path control word) may be stored at these points, $X_1$, $X_2$, $X_3$, $X_4$ in the integral path 14 (FIG. 1).

It should be noted that (a) If the bias voltage 16 (FIG. 1) was fixed at the average of optimum value, then the sensitivity at the lowest frequency would be the negation of the sensitivity of the highest frequency. In other words, $(X_2-X_1)=-1*(X_4-X_3)$. This is equivalent to $V_{bias}(t)=V_{bias\_av}$; (b) If the bias voltage 16 (FIG. 1) was tracking the optimum value such that the difference between the bias voltage 16 (FIG. 1) and the optimum voltage was static, then the sensitivity at the lowest frequency and at the highest frequency would match. i.e. $(X_2-X_1)=(X_4-X_3)$, this is equivalent to $V_{bias}(t)=V_{bias\_av}+V_{offset}+K_{sens}*(F_{fmcw}(t)-\text{mean}(F_{fmcw}(t)))$. Where $V_{offset}$ is an arbitrary undesired offset; and (c) If the oscillator 120 (FIG. 1) had zero sensitivity to bias voltage 16 (FIG. 1), then the sensitivity to the bias voltage 16 (FIG. 1) would be zero at both the top and the bottom of the waveform ($X_2-X_1=X_4-X_3=0$), this is equivalent to $V_{bias}(t)=V_{bias\_av}+K_{sens}*(F_{fmcw}(t)-\text{mean}(F_{fmcw}(t)))$. which corresponds to the optimum bias voltage.

Based on the above assumptions, the bias optimizing state machine 104 (FIG. 1) may implement the algorithm described in FIG. 6B to find the optimum bias voltage (minimum sensitivity point).

The process begins at 602 by setting initial values for the estimates of the average optimum bias and average sensitivity set to full scale (maximum voltage), and 0 respectively. The bias step is applied at 604 as per FIG. 6A, and at times $t_1$, $t_2$, $t_3$, $t_4$, the frequency control signals $X_1$, $X_2$, $X_3$, and $X_4$ are recorded at 606 in the integral path 14 (FIG. 1). The estimate of the average bias is updated at 608 with a step that is in proportion to $(X_2-X_1)+(X_4-X_3)$. The average sensitivity is updated with a step in proportion to $(X_2-X_1)-(X_4-X_3)$. Then, the algorithm iterates and returns to 604 until converging.

As such, by calculating the difference between frequency control signals at $t_1$, $t_2$ to determine a sensitivity of the bias voltage 16 (FIG. 1) at a minimum frequency, and the difference between frequency control signals at $t_3$, $t_4$ to determine bias voltage sensitivity at a maximum frequency, and applying the method of FIG. 6B between these points, the minimum sensitivity or optimum bias voltage can be found in FMCW systems.

Therefore, embodiments of the present disclosure, provide a system and method for suppressing noise up-conversion mechanisms in LC oscillators under stationary and transient conditions. The proposed system and associated method are based on a transfer function from bias voltage to frequency being proportional to a transfer function from a low frequency noise component to frequency that allows finding a local minimum at which a sensitivity of the oscillator's frequency to changes in the bias voltage is zero.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase-locked loop (PLL) circuit comprising:
   an oscillator;
   a frequency control device, the frequency control device generating a frequency control signal that controls a frequency of the oscillator; and
   a bias optimizer that monitors the frequency control device and generates a bias voltage for the oscillator,
   wherein the oscillator includes a transfer function from bias voltage to frequency that is proportional to a transfer function from a low frequency noise component to frequency, the transfer function from bias voltage to frequency having a convex shape with a local minimum at which a sensitivity of the frequency to changes in the bias voltage is zero, and wherein the bias voltage from the bias optimizer is set to the local minimum.

2. The PLL circuit of claim 1, wherein the oscillator comprises:
   an analog varactor structure for controlling the frequency of the oscillator;
   a plurality of controllable caps;
   a choke inductor, the choke inductor provides a DC current to a transistor independent of a gate bias;
   a power supply Vdd connected to a center tap of the choke inductor;
   a tank inductor, wherein a center tap of the tank inductor is controlled by the bias optimizer; and
   a coupling cap for providing that a DC value of a voltage in the transistor is decoupled from the bias voltage.

3. The PLL circuit of claim 1, further comprising:
   an analog proportional path controlling a capacitance of an analog varactor structure in the oscillator; and
   an integral path controlling a plurality of controllable caps in the oscillator.

4. The PLL circuit of claim 1, wherein the oscillator comprises a voltage controlled oscillator.

5. The PLL circuit of claim 1, wherein at a frequency close to DC, a common mode component of transistor noise is in series with the bias voltage.

6. The PLL circuit of claim 1, wherein up-conversion of a differential component of transistor noise is suppressed by a symmetry of the oscillator.

7. A method for suppressing noise up-conversion, the method comprising:
   providing a phase-locked loop (PLL) circuit comprising:
      an oscillator;
      a frequency control device, the frequency control device generating a frequency control signal that controls a frequency of the oscillator; and
      a bias optimizer that monitors the frequency control device and generates a bias voltage for the oscillator,
      wherein the oscillator includes a transfer function from bias voltage to frequency that is proportional to a transfer function from a low frequency noise component to frequency, the transfer function from bias voltage to frequency having a convex shape with a local minimum at which a sensitivity of the frequency to changes in the bias voltage is zero;
   determining the local minimum of the transfer function from bias voltage to frequency; and
   setting the bias voltage from the bias optimizer to the local minimum.

8. The method of claim 7, wherein determining the local minimum of the transfer function from bias voltage to frequency comprises:
   setting the bias voltage to a maximum value;
   allowing the PLL circuit to reach a steady-state frequency;
   recording, by the bias optimizer, a first frequency control signal;
   reducing, by the bias optimizer, the bias voltage by a differential amount, wherein a change to the bias voltage results in a change to the frequency of the oscillator;
   allowing the PLL circuit to reach a steady-state frequency;
   recording, by the bias optimizer, a second frequency control signal;
   calculating, by the bias optimizer, a difference between the first frequency control signal and the second frequency control signal, wherein the difference between the first frequency control signal and the second frequency control signal divided by the differential amount comprises a measure of a bias voltage to frequency transfer function gradient; and reducing the bias voltage by an amount proportional to the bias voltage to frequency transfer function gradient until the difference between the first frequency control signal and the second frequency control signal is equal to zero.

9. The method of claim 7, wherein the first frequency control signal and the second frequency control signal are recorded on an integral path of the PLL circuit.

10. The method of claim 9, wherein a gain of the integral path of the oscillator is constant.

11. The method of claim 7, wherein the difference between the first frequency control signal and the second frequency control signal corresponds to an amount the PLL circuit changed the first frequency control signal to correct for changes in the bias voltage.

12. The method of claim 7, wherein the difference between the first frequency control signal and the second frequency control signal is equal to zero when a minimum sensitivity point has been reached, the minimum sensitivity point comprises a point at which changes to the bias voltage do not affect the frequency of the oscillator, wherein the first frequency control signal and the second frequency control signal are equal at the minimum sensitivity point.

13. The method of claim 7, wherein the bias voltage asymptotically approaches the local minimum.

14. The method of claim 7, wherein the frequency of the oscillator comprises a non-stationary frequency, and determining the local minimum further comprises:

initializing an average bias voltage to a maximum voltage value and an average sensitivity of the bias voltage to zero;

applying a first bias step according to a frequency waveform;

recording frequency control signals at times corresponding to minimum frequency points and maximum frequency points; and updating the average bias voltage and the average sensitivity of the bias voltage with a step proportional to a difference between the recorded frequency control signals at minimum frequency and maximum frequency points.

15. The method of claim 14, wherein the non-stationary frequency of the oscillator comprises a Frequency Modulated Continuous Wave (FMCW).

16. The method of claim 7, wherein the oscillator comprises:

an analog varactor structure controlling the frequency of the oscillator;

a plurality of controllable caps;

a choke inductor, the choke inductor provides a DC current to a transistor independent of a gate bias;

a power supply Vdd connected to a center tap of the choke inductor;

a tank inductor, wherein a center tap of the tank inductor is controlled by the bias optimizer; and a coupling cap for providing that a DC value of a voltage in the transistor is decoupled from the bias voltage.

17. The method of claim 7, wherein the PLL circuit further comprises:

an analog proportional path controlling a capacitance of an analog varactor structure in the oscillator; and an integral path controlling a plurality of controllable caps in the oscillator.

18. The method of claim 7, wherein the oscillator comprises a voltage controlled oscillator.

19. The method of claim 7, wherein at a frequency close to DC, a common mode component of transistor noise is in series with the bias voltage.

20. The method of claim 7, wherein up-conversion of a differential component of transistor noise is suppressed by a symmetry of the oscillator.

* * * * *